United States Patent
Herrmann

(10) Patent No.: US 9,142,720 B2
(45) Date of Patent: Sep. 22, 2015

(54) THIN-FILM LIGHT EMITTING DIODE CHIP AND METHOD FOR PRODUCING A THIN-FILM LIGHT EMITTING DIODE CHIP

(75) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 84 days.

(21) Appl. No.: 12/525,066

(22) PCT Filed: Jan. 22, 2008

(86) PCT No.: PCT/EP2008/050716
§ 371 (c)(1),
(2), (4) Date: Dec. 2, 2009

(87) PCT Pub. No.: WO2008/092774
PCT Pub. Date: Aug. 7, 2008

(65) Prior Publication Data
US 2010/0072500 A1    Mar. 25, 2010

(30) Foreign Application Priority Data
Jan. 29, 2007 (DE) .......................... 10 2007 004 304

(51) Int. Cl.
| H01L 33/00 | (2010.01) |
| H01L 33/22 | (2010.01) |
| B29C 43/02 | (2006.01) |
| B29C 43/20 | (2006.01) |
| B29L 11/00 | (2006.01) |
| H01L 33/20 | (2010.01) |

(52) U.S. Cl.
CPC .............. *H01L 33/22* (2013.01); *B29C 43/021* (2013.01); *B29C 43/203* (2013.01); *B29L 2011/0016* (2013.01); *H01L 33/20* (2013.01); *H01L 2924/0002* (2013.01)

(58) Field of Classification Search
USPC ............. 438/782; 257/98, E33.067, E33.068, 257/E33.074
See application file for complete search history.

(56) References Cited

U.S. PATENT DOCUMENTS

| 4,894,751 A | 1/1990 | Wehnelt |
| 5,040,044 A | 8/1991 | Noguchi et al. |
| 5,779,924 A | 7/1998 | Krames et al. |
| 5,833,073 A | 11/1998 | Schatz et al. |

(Continued)

FOREIGN PATENT DOCUMENTS

| CN | 1271182 | 10/2000 |
| CN | 1317154 | 10/2001 |

(Continued)

OTHER PUBLICATIONS

I. Schnitzer et al., "30% External Quantum Efficiency from Surface Textured, Thin-Film Light-Emitting Diodes", Applied Physics Letters, vol. 63, No. 16, pp. 2174-2176, Oct. 18, 1993.

(Continued)

*Primary Examiner* — Thomas L Dickey
(74) *Attorney, Agent, or Firm* — Cozen O'Connor

(57) ABSTRACT

A thin-film light-emitting diode chip with a layer stack having a first emission surface and an opposite second emission surface, so that the thin-film light-emitting diode chip has at least two main emission directions. Measures for improving the outcoupling of the light generated in the layer sequence are provided on both the first and the second main emission surface. A method is disclosed for manufacturing a thin-film light-emitting diode chip.

18 Claims, 3 Drawing Sheets

(56) References Cited

U.S. PATENT DOCUMENTS

Figure 3:
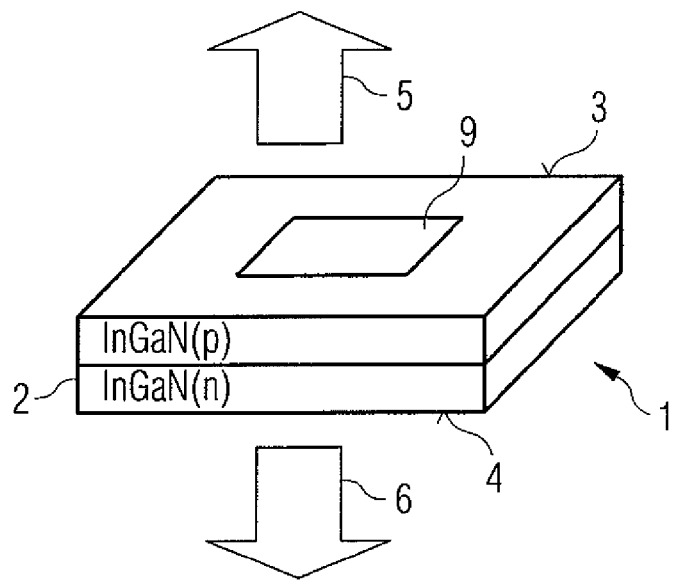

| | | | |
|---|---|---|---|
| 6,071,795 | A | 6/2000 | Cheung et al. |
| 6,372,608 | B1 | 4/2002 | Shimoda et al. |
| 6,441,403 | B1 | 8/2002 | Chang et al. |
| 6,559,075 | B1 | 5/2003 | Kelly et al. |
| 6,562,648 | B1 | 5/2003 | Wong et al. |
| 6,770,936 | B2 | 8/2004 | Inoue et al. |
| 6,876,003 | B1 | 4/2005 | Nakamura et al. |
| 6,878,563 | B2 | 4/2005 | Bader et al. |
| 6,888,237 | B1 | 5/2005 | Guenther |
| 6,906,346 | B2 | 6/2005 | Nishitani et al. |
| 6,956,241 | B2 | 10/2005 | Sugawara et al. |
| 6,956,246 | B1 | 10/2005 | Epler et al. |
| 7,078,737 | B2 | 7/2006 | Yuri et al. |
| 7,265,392 | B2 | 9/2007 | Hahn et al. |
| 7,528,077 | B2 | 5/2009 | Izuno et al. |
| 8,058,147 | B2 | 11/2011 | Herrmann et al. |
| 2002/0043929 | A1 | 4/2002 | Tazawa |
| 2002/0115265 | A1 | 8/2002 | Iwafuchi et al. |
| 2003/0075723 | A1* | 4/2003 | Heremans et al. ............. 257/98 |
| 2003/0153108 | A1 | 8/2003 | Durocher et al. |
| 2003/0178627 | A1 | 9/2003 | Marchl et al. |
| 2003/0189829 | A1 | 10/2003 | Shimizu et al. |
| 2003/0217805 | A1 | 11/2003 | Takayama et al. |
| 2004/0033638 | A1 | 2/2004 | Bader et al. |
| 2004/0047151 | A1 | 3/2004 | Bogner et al. |
| 2004/0048447 | A1 | 3/2004 | Kondo |
| 2004/0053449 | A1 | 3/2004 | Chang et al. |
| 2004/0068572 | A1 | 4/2004 | Wu |
| 2004/0099873 | A1 | 5/2004 | Illek |
| 2004/0099926 | A1 | 5/2004 | Yamazaki et al. |
| 2004/0110316 | A1 | 6/2004 | Ogihara et al. |
| 2004/0113167 | A1 | 6/2004 | Bader et al. |
| 2004/0149810 | A1 | 8/2004 | Yang et al. |
| 2004/0211968 | A1 | 10/2004 | Lin et al. |
| 2005/0033638 | A1 | 2/2005 | Donnet et al. |
| 2005/0105878 | A1 | 5/2005 | Wu |
| 2005/0110033 | A1 | 5/2005 | Heremans et al. |
| 2005/0116235 | A1 | 6/2005 | Schultz et al. |
| 2005/0148106 | A1 | 7/2005 | Iwafuchi et al. |
| 2005/0151147 | A1 | 7/2005 | Izuno et al. |
| 2005/0199891 | A1 | 9/2005 | Kunisato et al. |
| 2005/0207165 | A1 | 9/2005 | Shimizu et al. |
| 2005/0212007 | A1* | 9/2005 | Daniels et al. ................ 257/100 |
| 2005/0212098 | A1 | 9/2005 | Bogner et al. |
| 2005/0239270 | A1 | 10/2005 | Fehrer et al. |
| 2005/0274971 | A1 | 12/2005 | Wang et al. |
| 2006/0011923 | A1 | 1/2006 | Eisert et al. |
| 2006/0011925 | A1 | 1/2006 | Bader et al. |
| 2006/0043384 | A1 | 3/2006 | Cho et al. |
| 2006/0049423 | A1 | 3/2006 | Yamaguchi et al. |
| 2006/0051937 | A1 | 3/2006 | Ploessl et al. |
| 2006/0056474 | A1* | 3/2006 | Fujimoto et al. ........... 372/43.01 |
| 2006/0065905 | A1 | 3/2006 | Eisert et al. |
| 2006/0091409 | A1 | 5/2006 | Epler et al. |
| 2006/0097354 | A1 | 5/2006 | Ogihara et al. |
| 2006/0145170 | A1 | 7/2006 | Cho |
| 2006/0163595 | A1 | 7/2006 | Hsieh et al. |
| 2006/0175625 | A1 | 8/2006 | Yokotani et al. |
| 2006/0211923 | A1 | 9/2006 | Al-Ali et al. |
| 2006/0237735 | A1 | 10/2006 | Naulin et al. |
| 2007/0010067 | A1 | 1/2007 | Shimoda et al. |
| 2007/0190290 | A1 | 8/2007 | Gunther et al. |
| 2007/0207165 | A1 | 9/2007 | Thiry et al. |
| 2007/0242462 | A1 | 10/2007 | Van Laanen et al. |
| 2008/0128731 | A1* | 6/2008 | DenBaars et al. ............. 257/98 |
| 2008/0225523 | A1 | 9/2008 | De Samber et al. |
| 2009/0127573 | A1 | 5/2009 | Guenther et al. |
| 2009/0166645 | A1 | 7/2009 | Lee |

FOREIGN PATENT DOCUMENTS

| | | |
|---|---|---|
| CN | 1656620 | 8/2005 |
| DE | 100 17 336 | 10/2001 |
| DE | 100 20 464 | 11/2001 |
| DE | 100 40 448 | 3/2002 |
| DE | 100 41 328 | 3/2002 |
| DE | 100 51 465 | 5/2002 |
| DE | 103 03 977 | 11/2003 |
| DE | 102 34 978 | 2/2004 |
| DE | 202 20 258 | 2/2004 |
| DE | 102 45 628 | 4/2004 |
| DE | 102 45 631 | 4/2004 |
| DE | 103 39 985 | 3/2005 |
| DE | 103 53 679 | 6/2005 |
| DE | 10 2005 013 894 | 1/2006 |
| DE | 10 2004 036 962 | 3/2006 |
| DE | 10 2004 050 371 | 4/2006 |
| DE | 10 2005 055 293 | 2/2007 |
| DE | 10 2007 004 301 | 2/2008 |
| DE | 10 2007 004 303 | 2/2008 |
| DE | 10 2007 004 304 | 7/2008 |
| EP | 0 404 565 | 12/1990 |
| EP | 0 977 277 | 2/2000 |
| EP | 1 351 308 | 10/2003 |
| EP | 1 416 219 | 5/2004 |
| EP | 1 525 619 | 4/2005 |
| EP | 1 653 523 | 5/2006 |
| EP | 1 657 739 | 5/2006 |
| EP | 1 692 722 | 8/2006 |
| EP | 1 774 599 | 4/2007 |
| EP | 1 905 103 | 4/2008 |
| GB | 2 311 413 | 9/2007 |
| JP | 09-092878 | 4/1997 |
| JP | 10-200163 | 7/1998 |
| JP | 11-97518 | 4/1999 |
| JP | 2000-049382 | 2/2000 |
| JP | 2000-106454 | 4/2000 |
| JP | 2001-168344 | 6/2001 |
| JP | 2002-076523 | 3/2002 |
| JP | 2002-143797 | 5/2002 |
| JP | 2002-185039 | 6/2002 |
| JP | 2002-339952 | 11/2002 |
| JP | 2003-510853 | 3/2003 |
| JP | 2003-124528 | 4/2003 |
| JP | 2003-131137 | 5/2003 |
| JP | 2003-137073 | 5/2003 |
| JP | 2003-347524 | 12/2003 |
| JP | 2004-47691 | 2/2004 |
| JP | 2004-047975 | 2/2004 |
| JP | 2004-507094 | 3/2004 |
| JP | 2004-111905 | 4/2004 |
| JP | 2004-186685 | 7/2004 |
| JP | 2004-528349 | 9/2004 |
| JP | 2005-183777 | 7/2005 |
| JP | 2005-235778 | 9/2005 |
| JP | 2005-535144 | 11/2005 |
| JP | 2006-128512 | 5/2006 |
| JP | 2006-147787 | 6/2006 |
| JP | 2006-147889 | 6/2006 |
| JP | 2007-073968 | 3/2007 |
| JP | 2007-513520 | 5/2007 |
| JP | 2008-028352 | 2/2008 |
| JP | 2008-508699 | 3/2008 |
| JP | 2008-545267 | 12/2008 |
| JP | 2009-525614 | 7/2009 |
| JP | 2009-530832 | 8/2009 |
| KR | 10-0599012 | 7/2006 |
| TW | 416150 | 12/2000 |
| TW | 515103 | 12/2002 |
| TW | 091120976 | 8/2009 |
| TW | I 313062 | 8/2009 |
| WO | WO 98/14986 | 4/1998 |
| WO | WO 00/69000 | 11/2000 |
| WO | WO 01/24280 | 4/2001 |
| WO | WO 03/016782 | 2/2003 |
| WO | WO 2004/017407 | 2/2004 |
| WO | WO 2004/068572 | 8/2004 |
| WO | WO 2005/062382 | 7/2005 |
| WO | WO 2005/099310 | 10/2005 |
| WO | WO 2005/100016 | 10/2005 |
| WO | WO 2006/012838 | 2/2006 |
| WO | WO 2006/034671 | 4/2006 |
| WO | WO 2006/052330 | 5/2006 |

(56) References Cited

FOREIGN PATENT DOCUMENTS

| WO | WO 2007/001124 | 1/2007 |
|----|----------------|--------|
| WO | WO 2007/016908 | 2/2007 |
| WO | WO 2008/014750 | 2/2008 |
| WO | WO 2008/092774 | 8/2008 |

OTHER PUBLICATIONS

Data Sheet TechFilm BOLGER C-14 F, Polytec PT, Version 1, Jun. 2002 (pp. 2).
3M Grounded Heat Sink Bonding Film, 7373, Sep. 2001 (pp. 1-4).
Troller Schweizer Engineering AG: Vorhanggiessverfahren ("Curtain Coating"), P2005,0612 (pp. 2).
$M^3D$™ and Maskless Mesoscale™ Materials Deposition, OPTOMEC (pp. 2).
Preliminary Report on Patentability (with English translation) dated Mar. 12, 2008 issued for the underlying International PCT Application No. PCT/DE2006/001367.
Office Action issued on Apr. 4, 2011 for corresponding U.S. Appl. No. 12/376,425 (US 2010/0163915).
Notification for the Opinion of Examination, Taiwanese Application No. 096128339, (with English translation), Jun. 3, 2011.
Office Action issued on Sep. 23, 2011 for corresponding U.S. Appl. No. 12/376,425.

\* cited by examiner

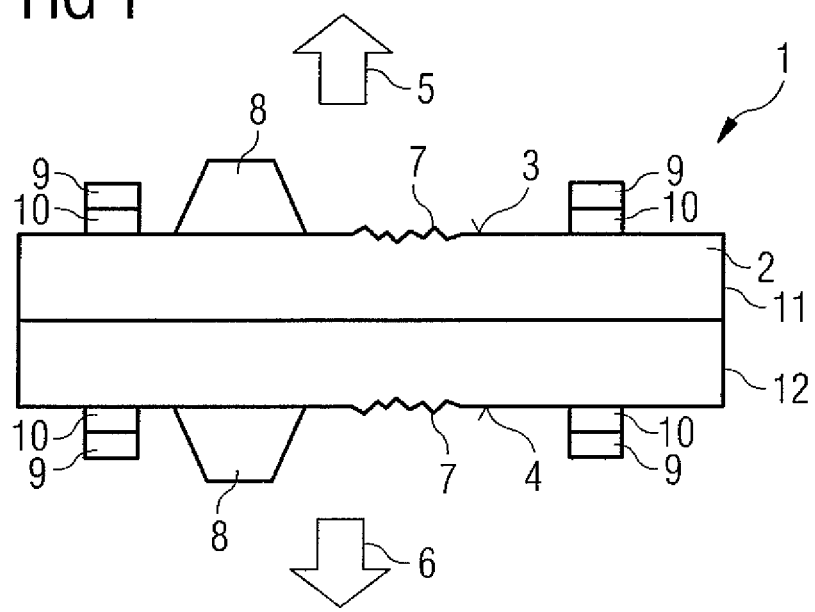
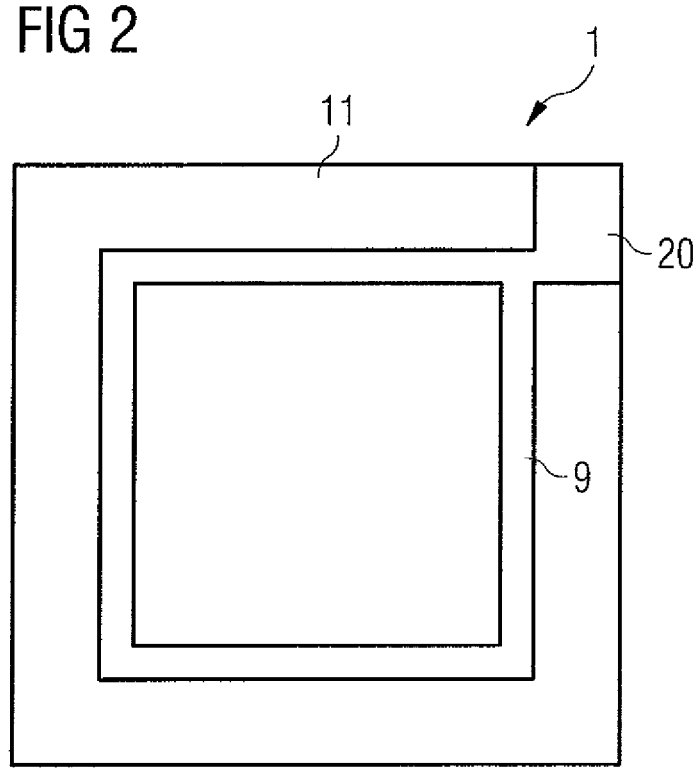

US 9,142,720 B2

THIN-FILM LIGHT EMITTING DIODE CHIP AND METHOD FOR PRODUCING A THIN-FILM LIGHT EMITTING DIODE CHIP

RELATED APPLICATIONS

This is a U.S. national stage of application No. PCT/EP2008/050716, filed on Jan. 22, 2008.

This patent application claims the priority of German Patent Application No. 10 2007 004 304.1, the disclosure of which is incorporated herein by reference.

FIELD OF THE INVENTION

The invention relates to a thin-film light-emitting diode chip as well as to a method for its manufacture.

BACKGROUND OF THE INVENTION

A semiconductor chip and a method for its manufacture are described in publication Application DE 100 40448 A1. A composite layer consisting of an active layer and a base layer is arranged on a substrate. In addition, a reinforcement layer and an auxiliary carrier layer, which are applied to the base layer galvanically before the substrate is detached, are added to the composite layer. For manipulating the semiconductor chip formed from the composite layer, a film is laminated on the side of the detached substrate.

A semiconductor chip is known from Utility Patent DE 202 200 258 U1 that comprises a semiconductor layer that is grown on a substrate, separated with a pulsed laser from a substrate and bonded to a carrier with its side that was detached from the substrate.

SUMMARY OF THE INVENTION

One object of the present invention is to provide a thin-film light-emitting diode chip with improved emission. Another object is to provide a method with which a thin-film light-emitting diode chip having good light emission can be manufactured in a simple manner.

These and other objects are attained in accordance with one aspect of the present invention directed to a thin-film light-emitting diode chip with a layer stack having a first emission surface and an opposite second emission surface, so that the thin-film light-emitting diode chip has at least two main emission directions, measures for improving the outcoupling of the light generated in the layer sequence being provided on both the first and the second main emission surface.

Another aspect of the present invention is directed to a method for producing a thin-film light-emitting diode chip having the steps: formation of a layer sequence suitable for the emission of light, in particular, from a semiconductor material, on a growth substrate; formation of a first electrically conductive contact material layer on a first side of the active layer sequence; structuring of the first contact material layer to form a contact surface; bonding of the structured first contact material layer to a carrier; removal of the growth substrate; formation of a second electrically conductive contact material layer on a second side of the active layer sequence opposite from the first side; structuring of the second contact material layer to form a contact surface; and separation of the structured first contact material layer from the carrier.

The thin-film light-emitting diode chip is therefore a semiconductor element that emits light in two main emission directions. The emission is also preferably symmetrical in both main emission directions. An essential prerequisite for this is that a substrate layer that could absorb light not be present on any side of the thin-film light-emitting diode chip. It is at least assured by the preferably symmetrical configuration of the thin-film light-emitting diode chip that the emissions properties in the two main emission directions are identical.

The efficiency of the thin-film light-emitting diode chip is increased by virtue of the fact that the measures for improving the outcoupling of the light produced in the layer sequence are taken on the main emission surfaces. At the boundary surfaces of the layer stack, there is a discontinuity in the index of refraction from the material of the layer stack on the one hand and the surrounding material on the other. This results in a refraction of the light at the transition from the layer stack to the environment. Depending on the angle in which a light beam of a photon strikes the boundary layer, a total reflection can occur. Due to the parallel surfaces of the layer stack, the reflected light beam strikes the opposing boundary surface at the same angle, so that total reflection occurs there as well. The consequence is that the light beam is extinguished in the layer stack and can therefore not contribute anything to the light emission. The angle at which a light beam strikes the surface is varied by virtue of the fact that the measures for improving the outcoupling of the light produced in the layer sequence are taken on both surfaces.

Measures for improving the outcoupling are to be understood above all else as surface structuring. In particular, an outcoupling of light can be made possible, for example, by a microprism structuring or an increase in the roughness of the main emission surface. If, as in an advantageous configuration of the invention, roughening of the surface is provided, an irregular surface is formed thereby, which improves the outcoupling of light. If, as in another advantageous configuration of the invention, outcoupling prisms are provided, then a different angle of incidence on a boundary surface likewise arises in the area of the outcoupling prisms than in the areas of the main emission surfaces adjacent to the outcoupling prisms. Consequently different positions of the boundary surfaces arise in different areas of the main emission surfaces, which likewise improve the outcoupling of light.

Another measure is the use of a photonic crystal, for example, as a layer in the main emission surfaces of the layer stack. This can have the effect that a part of the radiation that strikes the photonic crystal at an angle greater than or equal to the limit angle $\Theta$ is deflected in such a manner that it strikes the beam outcoupling surface at an angle less than the limit angle $\Theta$ and can therefore be outcoupled.

In addition to the optical function, the photonic crystal can also take on an electrical function, and can have properties such that it serves for current expansion, i.e., the current supplied via the contact surface is distributed in the photonic crystal onto a surface area of the layer stack that is larger in comparison to the contact surfaces.

Preferably, both the use of photonic crystals and the measures for improving the outcoupling, by means of surface structuring for example, are provided.

A peculiarity of the thin-film light-emitting diode chips of the invention is that the measures for improving the outcoupling of the light generated in the layer structure are provided on both surfaces of the layer structure. Conventional techniques for producing thin-film light-emitting diode chips do not permit the formation of identically formed surfaces on two sides of the layer stack.

The method according to an embodiment of the invention makes it possible to produce a symmetrical thin-film light-emitting diode chip, by which contact surfaces can be formed on both sides of a layer sequence by means of structured contact material layers and measures for improving the outcoupling of the light can be implemented. While a growth substrate initially assures the necessary stability of the layer sequence, and thus of the contact material layers, or later the contact areas, and the measures for improving the outcoupling of light can be created on the one side, a temporary carrier layer is subsequently applied to the already structured side, so that the growth substrate can be removed on the other side and the second side can be processed to form contact areas or to implement the measures for improving the outcoupling of light on the second side of the layer sequence.

Another measure for improving the efficiency of the thin-film light-emitting diode chips of the invention is to form the contact areas in such a manner that they are mirror-coated on the side facing the layer sequence. Light is thereby not absorbed in the contact areas, but is instead reflected and emitted on the opposing side. Since this is a component that emits light in two main emission directions, the reflected light is not lost, but instead is emitted in the opposite main emission direction.

To improve the current expansion, an indium-tin oxide layer (ITO) can be applied to one of the two surfaces of the layer sequence or to both surfaces of the layer sequence. An ITO layer is preferably applied to the surface of the p-doped layer sequence, whereby the lateral transverse conductivity on the p-doped side of the thin-film light-emitting diode chip advantageously improves.

The contact area is preferably applied to the ITO, which is preferably arranged on the surface of the p-doped layer sequence. The ITO layers can be applied to the entire surface of the p-doped layer sequence.

In another configuration of the thin-film light-emitting diode chip, a Bragg mirror can be applied to one of the surfaces of the layer sequence. The light produced in the layer sequence can thereby preferably be coupled out on the side opposite the Bragg mirror, i.e., only in one of the two main emission directions. Alternatively, a dielectric mirror can be applied to one of the surfaces of the layer sequence. By means of a mirror applied to one surface of the layer sequence, one obtains a unilaterally emitting thin-film light-emitting diode chip having a low thickness that preferably lies in the range between 5 and 7 μm.

DETAILED DESCRIPTION OF THE DRAWINGS

Figure 4:
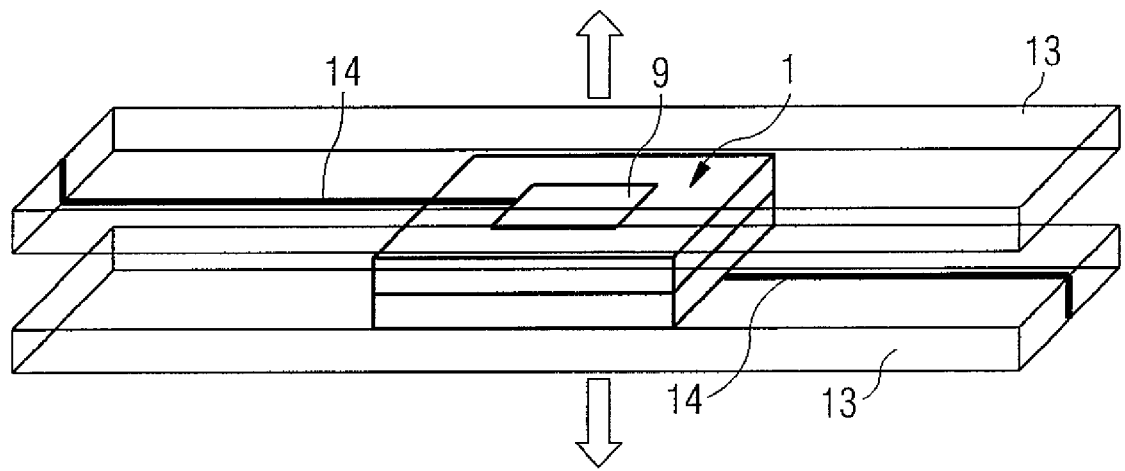

FIG. 1 shows a cross section through a thin-film light-emitting diode chip according to an embodiment of the invention, FIG. 2 shows a plan view onto one of the main emission surfaces of the thin-film light-emitting diode chip of FIG. 1, FIG. 3 shows a three-dimensional view of a thin-film light-emitting diode chip with differently shaped contact areas, FIG. 4 shows an arrangement of the thin-film light-emitting diode chip of FIG. 1 or FIG. 3 and transparent carrier films, and FIGS. 5A-5H show a thin-film light-emitting diode chip of FIG. 1 or FIG. 3 in various phases of production.

DETAILED DESCRIPTION OF THE DRAWINGS

A thin-film light-emitting diode chip that emits light on two main emission surfaces and in two main emission directions is shown in FIG. 1.

A thin-film light-emitting diode chip is distinguished by the following characteristic features, in particular:

the epitaxial layer sequence has a thickness in the range of 20 μm or less, in particular, in the range of 10 μm; and the epitaxial layer sequence contains at least one surface that has a mixing structure which leads in the ideal case to an approximately ergodic distribution in the ideal case; i.e., it has a stochastic scattering behavior that is as ergodic as possible.

A fundamental principle of a thin-film light-emitting diode chip is described in I. Schnitzer et al., Appl. Phys. Lett. 63 (16), Oct. 18, 1993, 2174-2176, the disclosure of which is hereby incorporated by reference.

A thin-film light-emitting diode chip is to a good approximation a Lambertian surface radiator, and is therefore particularly well suited for use in a headlamp.

In the invention the composite layer has an active layer sequence, preferably epitaxially grown on a growth substrate, for generating electromagnetic radiation. To produce a plurality of thin-film light-emitting diode chips, an extensive composite layer is divided into individual layer stacks. This so-called separation can be performed by sawing, for example. In the detailed description of embodiments of the invention below the structure of a single thin-film light-emitting diode chip, or a method for manufacturing such a chip, will be described. It goes without saying that the invention also extends to the manufacture in common of a plurality of identical thin-film light-emitting diode chips that are subsequently separated.

In the configuration for the sake of example in FIG. 1, a p-doped semiconductor layer 11 and an n-doped semiconductor layer 12 are provided, which form a light-emitting layer sequence. A nitride compound semiconductor is preferably used as the semiconductor material, which means that the active layer stack or at least one layer thereof is a nitride-III/V compound semiconductor material, preferably $Al_nGa_mIn_{1-n-m}N$, wherein $0 \leq n \leq 1$, $0 \leq m \leq 1$ and $n+m \leq 1$. This material need not necessarily be a mathematically exact composition according to the above formula. Instead it can comprise one or more dopants and additional constituents that do not substantially change the characteristic physical properties of the semiconductor material. For the sake of simplicity, the above formula contains only the essential constituents of the crystal lattice (Al, Ga, In, N), even though these can be replaced by small amounts of additional substances, e.g., P. A thin-film light-emitting diode chip having a nitride compound semiconductor emits mainly radiation with a wavelength in the short-wavelength region of the visible light spectrum.

The further formation of the thin-film light-emitting diode chip is identical on the upper side and the lower side, so that only the upper side 3 will be referred to below. The upper side 3 forms one of the main emission surfaces, the first main emission direction 5 lying perpendicular to this surface. In the embodiment according to FIG. 1, several measures corresponding to various aspects of the invention are implemented. The individual measures can also be implemented separately from one another in different embodiments of the invention.

A first measure is the roughening of the surface 3, an improvement of the outcoupling of the light generated in the layer structure 2 being achieved by the roughened sections 7. In the area of the roughened sections 7, the light encounters very different exit angles, so that the probability of striking the boundary surface at an angle not leading to total reflection is increased. These roughened sections are preferably produced by etching, i.e., in a wet chemical process. Crystals generally have different properties during etching on the upper and on the lower side, so that it can be advantageous to roughen or structure the different sides with different methods.

Another measure is the provision of outcoupling prisms 8, which can be provided in place of the roughened sections or in combination with them. By means of the outcoupling prisms, the angle at which a light beam towards the environment strikes the boundary surface is likewise changed with respect to the adjacent areas of the surface. There is thus an increased probability that a light beam that penetrates this area was already reflected at a different point of the surface 3 or 4.

Output coupling prisms are structured photolithographically. A layer of $SiO_2$ or SiN can be used as an etching mask. Thereafter there can be a dry chemical etching.

A third measure is a mirror-coating of the undersides of contact areas 9. The undersides are those areas of the contact areas that face the active layer sequence 2. Due to the mirror coatings 10, light generated in the layer sequence 2, which would normally strike the contact areas 9 and quite probably be absorbed there, is reflected by the mirror coating 10 back into the layer sequence 2, wherein this light then strikes the opposing boundary surface and can exit the layer sequence 2 there. Contact areas 9 provided with a mirror coating thus bring about an increased efficiency, since less light is absorbed, but instead a larger proportion of the total light generated is emitted in one of the two main emission directions 5 or 6.

As variations of the configuration shown and described, the electrical contacts 9 can be provided on the outcoupling prisms 8. An offset of the upper and lower contacts 9 is likewise possible, so that a different spatial position results. The emission characteristics remain essentially symmetrical.

To improve the current expansion, an indium-tin oxide layer (ITO) can be applied to one of the two surfaces of the semiconductor layers 11,12 or to both surfaces of the semiconductor layers 11, 12 (not shown). An ITO layer is preferably applied to the surface of the p-doped semiconductor layer 11, whereby the lateral transverse conductivity of the p-doped side of the thin-film light-emitting diode chip is advantageously increased. In this case, the contact areas 9, which are preferably provided with the mirror coatings 10, are arranged on the ITO layer. The ITO layer can also be applied over the entire surface of the p-doped semiconductor layer 11.

The layer stack 2 with the layers 11 and 12 typically has a height of less than 20 μm, preferably less than 10 μm. In a particularly favorable configuration of the invention, the layer stack has a height of 7 μm. One advantage of the low height of the layer stack is that the thin-film light-emitting diode chip is thereby flexible and there is a reduced risk that it will be destroyed by mechanical stress. Thereby flexible light-emitting films can be produced with the thin-film light-emitting diode chips of the invention.

The chip shown in FIG. 1 can be provided with a cover layer to protect the chip or to embed it in a larger unit. The cover layer can contain a converter material that converts, by luminescence, the light generated and emitted by the layer stack entirely or partially into light of a different wavelength, which is typically longer. Luminescent materials are stimulated by the light generated in the layer stack, so that they themselves emit radiation. As was mentioned, the converter material can be integrated into the cover layer, but an additional converter layer can also be formed.

In the plan view in FIG. 2, it is recognizable that a contact area is arranged in a frame shape on the upper side 3 of the active layer sequence 2. The advantage of the frame-shaped design is that little surface area is consumed, so that the area available for light emission is maximized. At the same time, a good current distribution across the surface of the thin-film light-emitting diode chip is assured. At one corner of the chip, a bonding area 20 can be recognized, which serves for subsequent contacting of the thin-film light-emitting diode chip 1 with conductor traces or bond wires. The measures described with reference to FIG. 1 for increasing the outcoupling of the light generated in the layer stack are likewise provided in the chip according to FIG. 2, but are not recognizable in the figure.

FIG. 3 shows a three-dimensional view of a thin-film light-emitting diode chip 1 according to the invention. As in FIG. 2, the measures for improving the outcoupling of light are not recognizable in this figure either. Differently from the embodiment according to FIGS. 1 and 2, in that of FIG. 3 a contiguous contact area 9 is provided in the central area of the surfaces of the main emitting surfaces. It covers a surface of only about 10 up to 20 percent of the main emission surfaces, so that a sufficiently large area for the emission of light is available.

It is recognizable in FIG. 4 how a thin-film light-emitting diode chip according to the invention can be connected to carrier films 13 in order to achieve an arrangement ready for use. The carrier films 13, between which the thin-film light-emitting diode chip 1 is accommodated, are made from a transparent material to allow emission in both main emission directions. On the sides of the carrier films 13 facing the thin-film light-emitting diode chip, contact strips 14 can be provided to allow electrical contacting of the light-emitting diode chip. The contacting is preferably effected via indium-tin oxide (ITO) contacts, so that no metal is necessary. Alternatively, the contact strips 14 can comprise gold or tin.

In a variation of the arrangement of FIG. 4, it can be advantageous if the contact areas of the light-emitting diode chip 1 lie on one side of light-emitting diode chip 1. Then only one of the carrier films 13 must be provided with contact strips 14, and connection of the arrangement is simplified.

In a variation of the arrangement of FIG. 4, a Bragg mirror can be applied to one of the surfaces of the layer sequence 11, 12. The light produced in the layer sequence can thereby preferably be coupled out on the side opposite the Bragg mirror, i.e., only in one of the two main emission directions. Alternatively, a dielectric mirror can be applied to one of the surfaces of the semiconductor layers 11, 12. By means of a mirror applied to one of the surfaces of the semiconductor layers 11, 12, one obtains a substrate-free thin-film light-emitting diode chip, emitting on one side, that has a low thickness, preferably lying in a range between 5 and 7 μm.

The steps that are performed in a method according to the invention in order to manufacture a thin-film light-emitting diode chip will be explained below with reference to FIGS. 5A-5H. In a first step, a layer sequence with layers 11 and 12 that is suitable for light emission is formed on a growth substrate 15. This can be done, for example, by epitaxial growth of several different layers, preferably containing a nitride compound semiconductor, on a sapphire or SiC substrate.

Figure 5A:
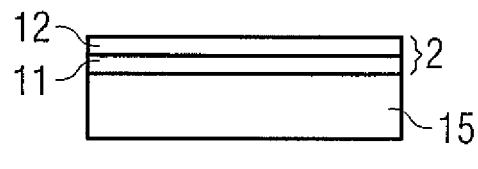
Figure 5E:
Figure 5B:
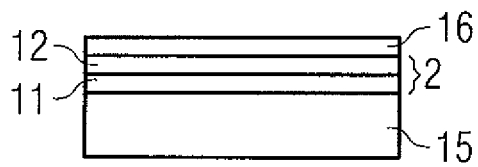

FIG. 5B shows another manufacturing step, in which a contact material layer 16 is applied to the active layer sequence with the layers 11 and 12. The contact material layer 16 is electrically conductive. It is particularly advantageous if the contact material layer 16 is produced in such a manner that a mirror coating that reflects the light generated in the active layer sequence without loss or with only low losses is formed on the underside. The mirror coating is preferably realized by a silver layer or a silver-containing layer.

The contact material layer 16 can be applied over the entire surface to the layer sequence with the layers 11 and 12. Alternatively, the contact material layer 16 can be applied in part, by means of a mask for example, to the places at which contact areas are later to be formed.

In the illustration according to FIG. 5B, the contact material layer 16 is applied over the entire surface.

Figure 5F:
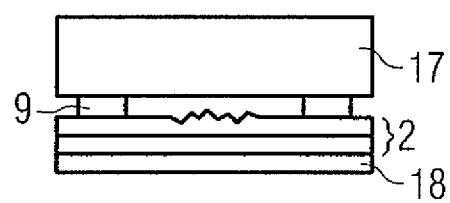
Figure 5C:
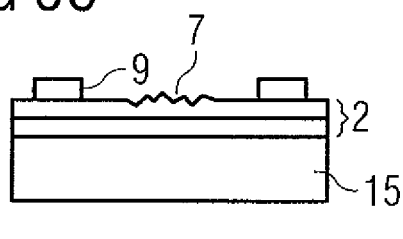
Figure 5G:
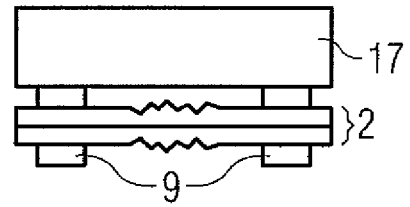

In the manufacturing step according to FIG. 5C, the contact material layer 16 is structured such that contact area 9 remains and the remainder of the contact material layer 16 is removed. Simultaneously or in a subsequent step, the surface of the layer sequence with the layers 11 and 12 can be roughened so that the outcoupling of light generated in the active layer sequence is improved. In an alternative configuration of the method, the roughening is performed before the contact material layer is applied. The roughening is then already present after the structuring of the contact material layer.

Figure 5D:
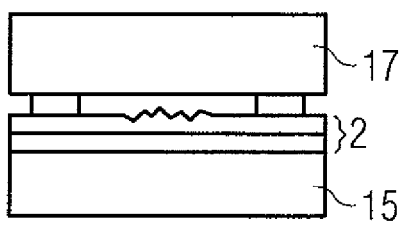

According to FIG. 5D, a carrier 17 is applied in an additional manufacturing step to the remainder of the contact material layer 16, which consists according to FIG. 5D only of the contact areas 9. After application of the carrier 17, the stability of the layer sequence with layers 11 and 12 is assured by the carrier 17 for further processing, so that the growth substrate 15 can be removed. The corresponding step is shown in FIG. 5E. The detachment of the growth substrate 15 can be performed by, for example, a laser detachment process as known from WO 98/14986. In essence, a boundary layer between the growth substrate 15 and the active layer sequence is irradiated through the growth substrate 15 with electromagnetic radiation, preferably laser radiation, so that a material decomposition due to absorption of the radiation takes place at the boundary surface. Thereby the growth substrate 15 and the active layer sequence 2 can be separated essentially non-destructively from one another. The growth substrate 15 can even be used again. Alternatively the growth substrate can be detached by etching or some other suitable lift-off method.

In order, on the other hand, to obtain a surface structure suitable for light emission and simultaneous contacting, a second contact material layer 18 is applied to the other side of the active layer sequence 2 in an additional manufacturing step according to FIG. 5F. As with the first contact material layer 16, the second contact material layer 18 is subsequently structured (FIG. 5G), so that contact areas 9 are obtained. The lower surface can be roughened simultaneously or subsequently, in order to improve the outcoupling. Stability is guaranteed during these processing steps by the carrier 17, as mentioned above.

Figure 5H:
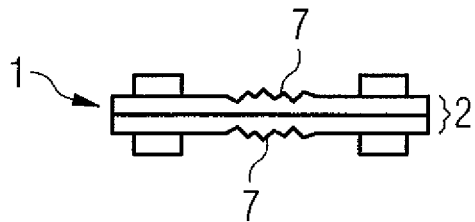

In the final step according to FIG. 5H, the carrier 17 is removed, so that a thin-film light-emitting diode chip available for further processing is obtained.

Instead of the roughening of the surfaces, outcoupling prisms or other suitable measures for the purpose can be used to improve the outcoupling of the light generated in the active layer sequence 2.

Both the roughening and the production of the outcoupling prisms can be performed by etching, i.e., structures are etched into the existing surface. In another technology to be used as an alternative, the surface is processed in a dry chemical manner with an ion plasma.

The carrier film 13 can contain a plastic material. Preferred materials for the carrier film 13 are, for example, glass, an epoxy resin, PET, a polymer, in particular, polyimide for example, Kapton, or a combination of these materials.

In addition, the carrier film contains carbon fibers in a preferred embodiment. These can be embedded in polymer film, for example, and can have a higher thermal conductivity than the polymer film, so that an adhesive and thermally conductive carrier layer advantageously results.

The carrier layer can further comprise a glass fabric, in particular, a silicate. ITO (indium-tin oxide) coated glass films are particularly suitable.

It is advantageous for the contact strips if conductive and simultaneously transparent materials are used, as is the case for so-called "transparent conductive oxide" (TCO). A suitable material is indium-tin oxide (ITO).

As a lower boundary for the thickness of the radiation-emitting layer sequence 2, 6 µm is provided according to the invention. The upper boundary is ca. 20 µm.

Another measure for forming outcoupling structures is the provision of photonic crystals, e.g., as an additional layer on the main emission surfaces 3 and 4 of the layer stack 2. The photonic crystal preferably comprises a plurality of lower areas with a first index of refraction and a plurality of second areas with a second index of refraction. It is particularly preferable if the areas are arranged regularly. The regular arrangement can correspond to a one-dimensional, a two-dimensional or a three-dimensional lattice. In particular, the photonic crystal within the scope of the invention can have the structure of a two-dimensional lattice. The distance between two adjacent first areas or two adjacent second areas corresponds to the lattice constant. The photonic crystal best achieves its effect if the lattice constant is matched to a wavelength of the radiation generated by the semiconductor body. The distance between two adjacent first areas or two adjacent second areas preferably corresponds to approximately the wavelength of the radiation generated by the layer stack. The distance especially preferably lies between $10^{-9}$ m and $10^{-6}$ m.

In addition to the described construction, in which the thin-film light-emitting diode chip is held between two transparent films, an embedded construction can also be implemented, wherein the molding material used on both sides is transparent. Particular attention must be paid to heat dissipation. To assure sufficient heat dissipation, a silver-filled epoxy adhesive film containing 80% silver and 20% nonvolatile epoxy resin can be used as the carrier film 13. The silver-filled epoxy adhesive is applied to the thin-film light-emitting diode chip 1 and then heated to 80° C. up to 90° C. The adhesive film is slightly melted in the process, whereby it receives good primary adhesion. Subsequently the film is cured at a temperature of roughly 150° C. The carrier layer 2 originating in this way is electrically conductive and has a gas transition temperature of 150° C. up to 155° C. The carrier layer 13 is also chemically and thermally resistant. Because of the small thickness, however, there is a certain elasticity. For the carrier layer 13 in particular, however, it is possible to use any other material, preferably plastic material, that has properties corresponding to the properties of the epoxy adhesive film described for the sake of example.

In addition, a passivation of the chip on all sides, e.g., with silicon dioxide ($SiO_2$), can be provided.

The carrier film can either be configured to be electrically conductive as a whole, or only conductor traces as in FIG. 4 can be constructed, while the remaining areas of the carrier films 13 are not conductive.

In another implementation, the thin-film light-emitting diode chip can be used in a lighting device or in a sensor.

The invention is not limited to the exemplary embodiments that were presented; rather, a number of variations are possible and are comprised by the invention. In particular, the various measures for improving the outcoupling of light need not be used only in connection with one another, but each can also be used on its own. The mirror coating of the contact areas 9 also need not necessarily be used in combination with the roughening or the outcoupling prisms; rather, each of the mechanisms can be used independently of the others.

The invention claimed is:

1. A thin-film light-emitting diode chip comprising a layer sequence having a first main emission surface and an opposite second main emission surface, so that the thin-film light-emitting diode chip has at least two opposite main emission directions, the thin-film light-emitting diode chip emitting light through the first main emission surface and through the opposite second main emission surface in said two opposite main emission directions, wherein measures for improving the outcoupling of the light generated in the layer sequence, in both of the main emission directions, are provided on both the first and the second main emission surfaces, wherein the thin-film light-emitting diode chip does not include a substrate, and wherein the first and second main emission surfaces each have an exposed portion facing in a direction away from the layer sequence so as to emit light away from the layer sequence,
wherein contact areas are provided on at least one of the main emission surfaces for connecting the thin-film light-emitting diode chip, and
wherein a mirror coating is provided on the side of contact areas facing the layer sequence.

2. The thin-film light-emitting diode chip according to claim 1, wherein the main emission surfaces of the layer sequence are at least partially roughened to improve the outcoupling of the light generated in the layer sequence.

3. The thin-film light-emitting diode chip according to claim 2, wherein a roughened section is produced in a wet-chemical or dry-chemical process.

4. The thin-film light-emitting diode chip according to claim 1, wherein outcoupling prisms are formed on the main emission surfaces to improve the outcoupling of the light generated in the layer sequence.

5. The thin-film light-emitting diode chip according to claim 1, wherein the contact areas are strip-shaped, for distributing current to various areas of the layer sequence.

6. The thin-film light-emitting diode chip according to claim 5, wherein the strip-shaped contact areas are frame-shaped.

7. The thin-film light-emitting diode chip according to claim 1, wherein the thickness of the layer sequence lies between 5 μm and 15 μm.

8. The thin-film light-emitting diode chip according to claim 1, wherein the layer sequence has adjacent layers of an n-doped InGaN and a p-doped InGaN.

9. An arrangement comprising a thin-film light-emitting diode chip according to claim 1 and transparent carrier films, each bearing contact traces, wherein the contact traces are each connected to the contact areas of the thin-film light-emitting diode chip.

10. The thin-film light-emitting diode chip according to claim 1, wherein the emission in the two main emission directions is symmetrical.

11. A thin-film light-emitting diode chip comprising a layer sequence having a first main emission surface and an opposite second main emission surface, so that the thin-film light-emitting diode chip has at least two opposite main emission directions, the thin-film light-emitting diode chip emitting light through the first main emission surface and through the opposite second main emission surface in said two opposite main emission directions, wherein measures for improving the outcoupling of the light generated in the layer sequence, in both of the main emission directions, are provided on both the first and the second main emission surfaces, wherein the thin-film light-emitting diode chip does not include a substrate, and wherein the first and second main emission surfaces each have an exposed portion facing in a direction away from the layer sequence so as to emit light away from the layer sequence,
wherein the main emission surfaces of the layer sequence are at least partially roughened to improve the outcoupling of the light generated in the layer sequence, and
wherein the structure size of the roughened sections is about 350 nm.

12. An arrangement comprising:
a thin-film light-emitting diode chip having a layer sequence having a first main emission surface and an opposite second main emission surface, so that the thin-film light-emitting diode chip has at least two opposite main emission directions, the thin-film light-emitting diode chip emitting light through the first main emission surface and through the opposite second main emission surface in said two opposite main emission directions, wherein measures for improving the outcoupling of the light generated in the layer sequence, in both of the main emission directions, are provided on both the first and the second main emission surfaces, wherein the thin-film light-emitting diode chip does not include a substrate, and wherein the first and second main emission surfaces each have an exposed portion facing in a direction away from the layer sequence so as to emit light away from the layer sequence; and
transparent carrier films, each bearing contact traces, wherein the contact traces are each connected to the contact areas of the thin-film light-emitting diode chip,
wherein the contact traces are made of indium-tin oxide.

13. A method for manufacturing a thin-film light-emitting diode chip comprising the steps of:
forming a layer sequence suitable for emitting light through a first main emission surface and through an opposite second main emission surface in two opposite main emission directions from a semiconductor material on a growth substrate;
forming an electrically conductive first contact material layer on a first side of the layer sequence;
structuring the first contact material layer to form a contact area;
connecting the structured first contact material layer to a carrier;
removing the growth substrate;
forming an electrically conductive second contact material layer on a second side of the layer sequence on the opposite side from the first side of the layer sequence;
structuring the second contact material layer to form a contact area; and
separating the first contact material layer from the carrier,
wherein measures for improving the outcoupling of the light generated in the layer sequence, in both of the main emission directions, are provided on both the first and the second sides of the layer sequence,
wherein, after the removing of the growth substrate, the thin-film light-emitting diode chip does not include a substrate,
wherein the first and second main emission surfaces each are provided with an exposed portion facing in a direction away from the layer sequence so as to emit light away from the layer sequence, and
wherein the contact material layers are applied in such a manner that the sides facing the layer sequence are mirror-coated.

14. The method according to claim 13, wherein areas of the active layer sequence that are free of the first contact material layer are roughened on their surface.

15. The method of claim 14, wherein areas of the active layer sequence that are free of the first contact material layer are roughened on their surface by a wet-chemical process.

16. The method according to claim 13, wherein areas of the layer sequence that are free of the second contact material layer are roughened on their surface.

17. The method of claim 16, wherein areas of the active layer sequence that are free of the second contact material layer are roughened on their surface by a wet-chemical process.

18. The method according to claim 13, wherein during or after the structuring of the first and/or second contact material layer, outcoupling prisms are formed on the surface of the layer sequence.

\* \* \* \* \*